(12) United States Patent
Sun et al.

(10) Patent No.: US 9,726,955 B2
(45) Date of Patent: Aug. 8, 2017

(54) MANUFACTURE METHOD OF TFT ARRAY SUBSTRATE AND TFT ARRAY SUBSTRATE STURCTURE

(71) Applicant: Shenzhen China Star Optoelectronics Technology Co., Ltd., Shenzhen, Guangdong (CN)

(72) Inventors: Bo Sun, Guangdong (CN); Hongyuan Xu, Guangdong (CN); Hsiangchih Hsiao, Guangdong (CN); Changi Su, Guangdong (CN); Mian Zeng, Guangdong (CN); Xiaoxiao Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 88 days.

(21) Appl. No.: 14/430,205

(22) PCT Filed: Sep. 11, 2014

(86) PCT No.: PCT/CN2014/086264
§ 371 (c)(1),
(2) Date: Mar. 20, 2015

(87) PCT Pub. No.: WO2016/026183
PCT Pub. Date: Feb. 25, 2016

(65) Prior Publication Data
US 2016/0259191 A1    Sep. 8, 2016

(30) Foreign Application Priority Data
Aug. 21, 2014 (CN) .......................... 2014 1 0415951

(51) Int. Cl.
*G02F 1/1368* (2006.01)
*H01L 21/12* (2006.01)
(Continued)

(52) U.S. Cl.
CPC ............ *G02F 1/1368* (2013.01); *G02F 1/136* (2013.01); *G02F 1/13439* (2013.01);
(Continued)

(58) Field of Classification Search
CPC .. G02F 1/1368; G02F 1/136; G02F 1/133514; G02F 1/134309;
(Continued)

(56) References Cited

U.S. PATENT DOCUMENTS

2005/0082534 A1* 4/2005 Kim .................... H01L 51/5215
257/72
2006/0252168 A1* 11/2006 Rhee ................. G02F 1/136227
438/28
(Continued)

FOREIGN PATENT DOCUMENTS

CN            1610461 A       4/2005

*Primary Examiner* — Galina Yushina
(74) *Attorney, Agent, or Firm* — Andrew C. Cheng

(57) ABSTRACT

The present invention provides a manufacture method of a TFT array substrate and a TFT array substrate structure, and the TFT array substrate structure comprises a substrate (1), a first metal electrode (2) on the substrate (1), a gate isolation layer (3) positioned on the substrate (1) and completely covering the first metal electrode (2), an island shaped semiconductor layer (4) on the gate isolation layer (3), a second metal electrode (6) on the gate isolation layer (3) and the island shaped semiconductor layer (4), a protecting layer (8) on the second metal electrode (6), a color resist layer (7) on the protecting layer (8), a protecting layer (12) on the color resist layer (7) and a first pixel electrode layer (9) on the protecting layer (12); a via (81) is formed on the protecting layer (8), the color resist layer (7) and the protecting layer (12), and an organic material layer (10) fills the inside of the via (81).

6 Claims, 7 Drawing Sheets

(51) Int. Cl.
*G02F 1/136* (2006.01)
*H01L 21/84* (2006.01)
*H01L 27/12* (2006.01)
*G02F 1/1335* (2006.01)
*G02F 1/1343* (2006.01)
*H01L 21/02* (2006.01)
*H01L 21/027* (2006.01)
*H01L 21/285* (2006.01)
*H01L 29/66* (2006.01)
*H01L 29/786* (2006.01)
*G02F 1/1362* (2006.01)
*G02F 1/1333* (2006.01)

(52) U.S. Cl.
CPC .. *G02F 1/133514* (2013.01); *G02F 1/134309* (2013.01); *G02F 1/136227* (2013.01); *H01L 21/0273* (2013.01); *H01L 21/02422* (2013.01); *H01L 21/02532* (2013.01); *H01L 21/02592* (2013.01); *H01L 21/2855* (2013.01); *H01L 21/84* (2013.01); *H01L 27/12* (2013.01); *H01L 27/1218* (2013.01); *H01L 27/1222* (2013.01); *H01L 27/1288* (2013.01); *H01L 29/66765* (2013.01); *H01L 29/78669* (2013.01); *G02F 2001/133302* (2013.01); *G02F 2001/133519* (2013.01); *G02F 2001/136222* (2013.01)

(58) Field of Classification Search
CPC ........ G02F 2001/133302; G02F 2001/133518; H01L 21/02422; H01L 21/02532; H01L 21/02592; H01L 21/0273; H01L 21/2855; H01L 21/0271; H01L 21/0274; H01L 21/28556; H01L 27/1218; H01L 27/1222; H01L 27/1288; H01L 27/1214; H01L 27/32; H01L 29/66765; H01L 29/78669; H01L 29/6675
See application file for complete search history.

(56) References Cited

U.S. PATENT DOCUMENTS

| | | | |
|---|---|---|---|
| 2008/0128719 A1* | 6/2008 | Cheng | G02F 1/136227 257/89 |
| 2008/0198319 A1* | 8/2008 | Kim | G02F 1/13454 349/147 |
| 2009/0190054 A1* | 7/2009 | Kim | G02F 1/13394 349/42 |
| 2011/0169001 A1* | 7/2011 | Ozeki | H01L 29/78696 257/59 |
| 2014/0167036 A1* | 6/2014 | Cheng | H01L 29/78618 257/43 |

* cited by examiner

MANUFACTURE METHOD OF TFT ARRAY SUBSTRATE AND TFT ARRAY SUBSTRATE STURCTURE

CROSS-REFERENCE TO RELATED APPLICATIONS

This application is a national phase of PCT application PCT/CN2014/086264, filed on Sep. 11, 2014, which claims the priority of Chinese Patent Application No. 201410415951.5 filed on Aug. 21, 2014.

FIELD OF THE INVENTION

The present invention relates to a display technology field, and more particularly to a manufacture method of a TFT array substrate and a TFT array substrate structure.

BACKGROUND OF THE INVENTION

A flat panel display possesses advantages of being ultra thin, power saved and radiation free and has been widely utilized. Present flat panel displays mainly comprise LCDs (Liquid Crystal Display) or OLEDs (Organic Light Emitting Display). Regarding of flat panel displays, a Thin Film Transistor Liquid Crystal Display (TFT-LCD) has characteristics of small volume, low power consumption, relatively lower manufacture cost, radiation free and etc. which has dominated the main flat panel display market.

The main principle of the liquid crystal display screens is that the back light creates white light, and after the light passes through the polaroid of the array substrate, the polarization state of light is changed because of the different twisted angles of the liquid crystal. After the light passes through the polaroid of CF, the different brightnesses are resulted for the different pixels. In the full color display, a color filter layer is added on the CF substrate to obtain different mixed light intensities for different pixels RGB of the three primary colors to realize the color display.

For increasing the aperture ratio and reducing the influence of the pixel parasite capacitance, the present COA (Color Filter on Array) technology has been widely utilized. The COA technology is a kind of integration skill of combining the color filter and array substrate as one. That is, the color resist is coated on an accomplished array to form a color filter layer, which can improve the issue of low aperture ratio of the traditional color filter.

In a traditional structure of a liquid crystal display, two glass substrates sandwich the liquid crystal layer inbetween. The thin film transistors (TFT) are manufacture on one glass substrate for driving the orientations of the liquid crystal for controlling the display of every pixel; the color filter is formed on the other glass substrate to be utilized for forming colors of every pixel. The Color Filter on Array integration technology is to manufacture the TFT and color filter on the same glass substrate. Such technology possesses advantages below:

(1) Self-alignment of upper and lower substrates. In the traditional structure, the two glass substrate require the alignments of the corresponding pixels on the two glass substrates and a cell process is implemented, i.e. the alignment procedure after the manufactures of TFT and color filter are manufactured on the two glass substrates in the front and the rear. The accuracy of the cell process directly influences the quality of the liquid crystal display. Once the COA technology is utilized, because the TFT and color filter are both provided on the same glass substrate and self-alignment is inherently achieved. There is no need for an additional alignment procedure. As a result, the process can be simplified and the product quality is improved.

(2) Manufacture cost reduction. The color filter takes a large ratio in the manufacture cost of the liquid crystal displays. The manufacture cost can be effectively reduced by forming the color filter on the TFT and eliminating the processes of manufacturing the color filter; besides, the color filter significantly affects the performance but the makers of the color filter and the liquid crystal display are different. The man power, the money can be wasted for the considered cooperation and the quality is hard for guarantee. On the contrary, the COA technology can solve the aforesaid problems and reduce the manufacture cost.

(3) Improvement of production performance. The aperture ratio is increased and the penetration ratio is raised. Once the Color Filter on Array is implemented, the line width of the black matrix can be narrowed down from 27 μm to 10 μm. The aperture ratio can be increased with 15%. The corresponding penetration ratio is enormously raised, too However, the thickness of the Color Filter on Array is thicker and in general has a thickness of several micrometers. The vias for connecting the signal lines and the pixel electrodes have to be large for guaranteeing the effective contacts. Such larger vias may cause issues of bubbles, decrease of the aperture ratio, the orientation disorder of the liquid crystal and abnormal alignment and etc.

SUMMARY OF THE INVENTION

An objective of the present invention is to provide a manufacture method of a TFT array substrate. The manufacture method is simple and as a TFT array substrate manufactured by the method is utilized in a liquid crystal display, the bubble issue can be prevented to raise the pixel aperture ratio, avoiding the orientation disorder of the liquid crystal and increasing the uniformity of the electric field in the curing process.

Another objective of the present invention is to provide a TFT array substrate structure, which the structure and the process are simple, and bubbles are hardly generated in a liquid crystal display utilizing the structure. The pixel aperture ratio is higher and no orientation disorder phenomenon of the liquid crystal occurs.

For realizing the aforesaid objective, the present invention provides a manufacture method of a TFT array substrate, comprising steps of:

step 1, providing a substrate, and deposing and patterning a first metal layer on the substrate to form a first metal electrode;

step 2, forming a gate isolation layer and an island shaped semiconductor layer on the first metal electrode and the substrate;

step 3, deposing and patterning a second metal layer on the gate isolation layer and the island shaped semiconductor layer to form a second metal electrode;

step 4, deposing and patterning a first layer on the second metal electrode for forming a first protecting layer;

step 5, coating a color resist layer on the first protecting layer, and deposing and patterning a second layer on the color resist layer for forming a second protecting layer, and forming a via in and extending in sequence through the second protecting layer, the color resist layer and the first protecting layer; and step 6, forming a pixel electrode layer and an organic material layer on the second protecting layer and the second metal electrode.

Specifically, the step 6 comprises:

step 61, deposing and patterning a first pixel electrode layer on the second protecting layer and the second metal electrode for forming a first pixel electrode, which connects to the second metal electrode with the via;

step 62, coating the organic material layer on the first pixel electrode such as to fill the via; and step 63, implementing a developing process to remove a portion of the organic material layer outside the via.

Specifically, the step 6 comprises:

step 611, deposing a first pixel electrode layer on the second protecting layer and the second metal electrode;

step 612, coating the organic material layer on the first pixel electrode layer fills such as to fill the via;

step 613, implementing a developing process to remove portions of the organic material layer that are located around the via;

step 614, deposing a second pixel electrode layer on the first pixel electrode layer and remains of the organic material layer in the via; and step 615, patterning the first pixel electrode layer and the second pixel electrode layer at the same time with one photolithography process for forming the first pixel electrode and the second pixel electrode, such that the first pixel electrode layer and the second pixel electrode layer connect to the second metal electrode with the via.

From the step 1 to the step 4, a Physical Vapor Deposition or a Chemical Vapor Deposition is employed for deposing the first metal electrode layer, the gate isolation layer, a semiconductor layer from which the island shaped semiconductor layer was formed, the second metal electrode layer and the first and second protecting layers.

In the step 1, the substrate is a glass substrate; in the step 2, the island shaped semiconductor layer is formed with amorphous silicon, and the gate isolation layer and the island shaped semiconductor layer are sequentially formed by processes of film formation, exposure, development and etching.

In the step 5, the color resist layer is a red/green/blue color resist layer, and a diameter of a top of the via 20 μm, and the organic material layer is formed with a photoresist type material.

In the step 61, a Physical Vapor Deposition is employed for deposing the first pixel electrode layer, and a material of the first pixel electrode layer is ITO or IZO.

A Physical Vapor Deposition is employed for deposing the first pixel electrode layer and the second pixel electrode layer, and a material of each of the first pixel electrode layer and the second pixel electrode layer is ITO or IZO.

The present invention further provides a TFT array substrate structure, comprising a substrate, a first metal electrode on the substrate, a gate isolation layer positioned on the substrate and completely covering the first metal electrode, an island shaped semiconductor layer on the gate isolation layer, a second metal electrode on the gate isolation layer and the island shaped semiconductor layer, a protecting layer on the second metal electrode, a color resist layer on the protecting layer, a protecting layer on the color resist layer and a first pixel electrode layer on the protecting layer; a via is formed on the protecting layer, the color resist layer and the protecting layer, and an organic material layer fills the inside of the via; the substrate is a glass substrate, and the island shaped semiconductor layer is formed with amorphous silicon, and the color resist layer is a RGB color resist layer, and material of the first pixel electrode layer is ITO or IZO, and the organic material layer is formed with photoresist type material.

The TFT array substrate structure further comprises a second pixel electrode layer on the first pixel electrode layer and the organic material layer, and material of the second pixel electrode layer is ITO or IZO.

The benefits of the present invention are: according to the manufacture method of the TFT array substrate and the TFT array substrate structure provided by the present invention, by filling the via with organic material and forming two pixel electrode layers to reduce the height difference of the landform thereof. Basically, the pixel utilizing the structure is totally flat and smooth. The effective control area of the pixel electrode is increased to raise the pixel aperture ratio; the risk of bubble appearance is diminished because the larger via is filled up to reduce the height difference of the landform; the uniformity of the curing electric field is increased to prevent the orientation disorder of the liquid crystal because the liquid crystal at the via can be effectively controlled and no landform difference in the electric field.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
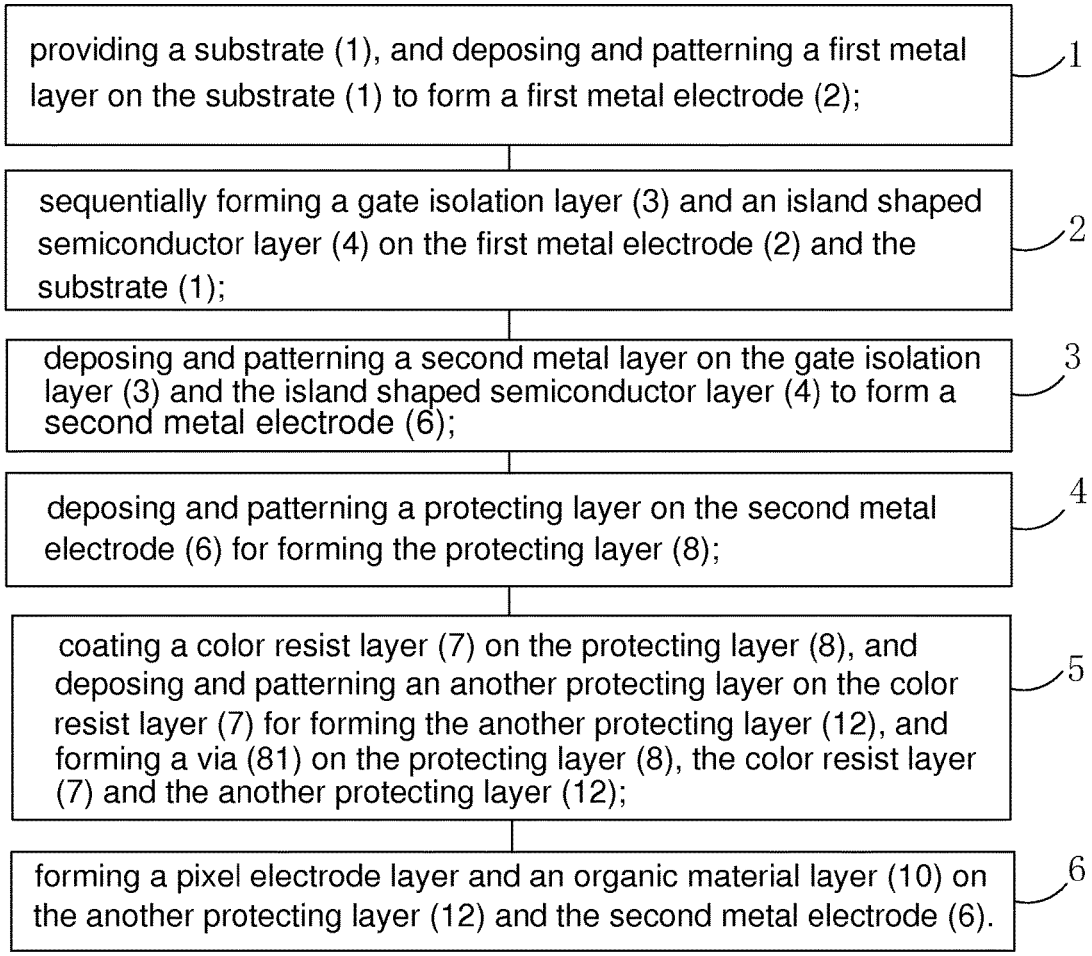
FIG. 1 is a flowchart of a manufacture method of a TFT array substrate according to the present invention.

Please refer to FIG. 1, which is a flowchart of a manufacture method of a TFT array substrate according to the present invention; in this specification, two embodiments are employed for describing the manufacture method of the TFT array substrate.

Figure 2:
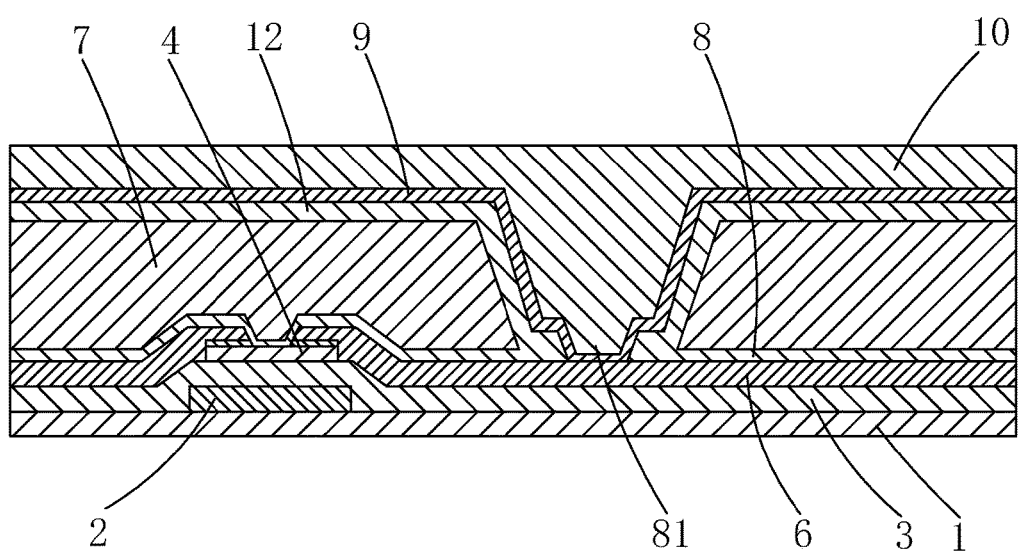
FIG. 2 is a diagram of step 7 in the first embodiment of the manufacture method of the TFT array substrate according to the present invention.
Figure 3:
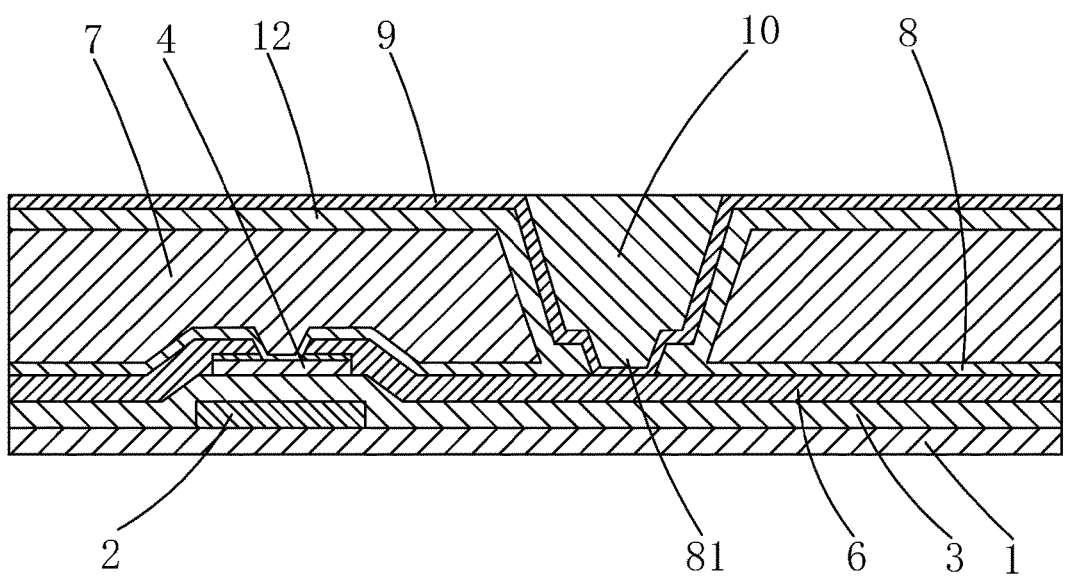
FIG. 3 is a diagram of step 8 in the first embodiment of the manufacture method of the TFT array substrate according to the present invention.
Figure 4:
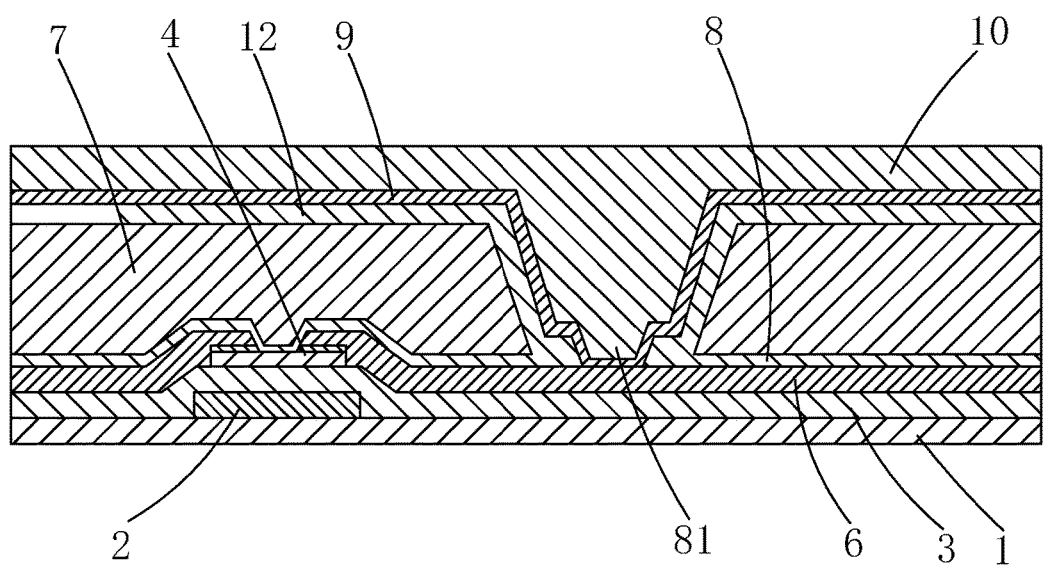
FIG. 4 is a diagram of step 7 in the second embodiment of the manufacture method of the TFT array substrate according to the present invention.
Figure 5:
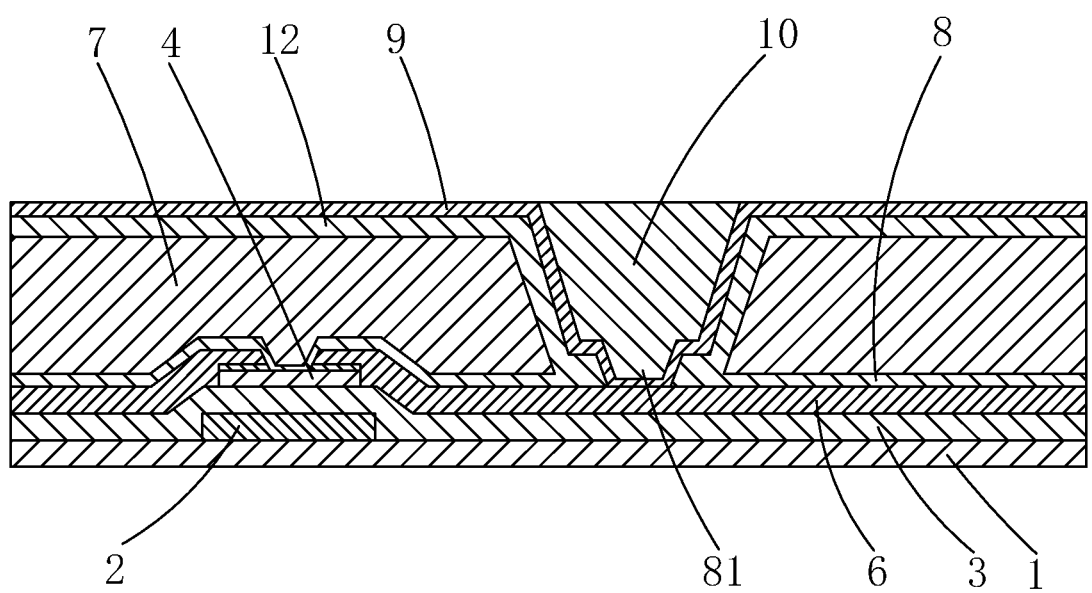
FIG. 5 is a diagram of step 8 in the second embodiment of the manufacture method of the TFT array substrate according to the present invention.
Figure 6:
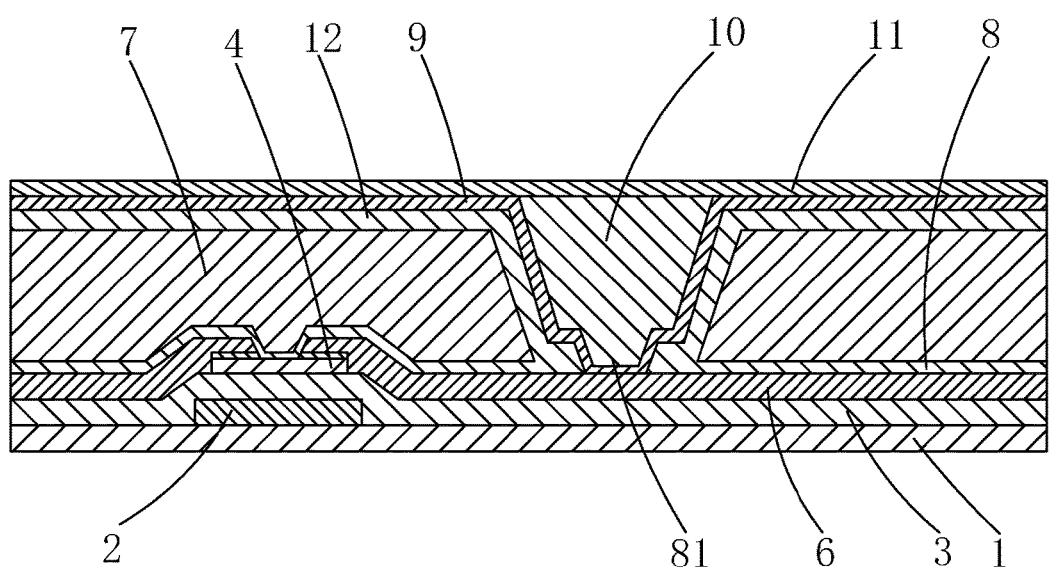
FIG. 6 is a diagram of step 9 in the second embodiment of the manufacture method of the TFT array substrate according to the present invention.

Please refer from FIG. 1 to FIG. 3. The first embodiment of the manufacture method of the TFT array substrate according to the present invention comprises steps of:

step 1, providing a substrate 1, and deposing and patterning a first metal layer on the substrate 1 to form a first metal electrode 2.

Preferably, the substrate 1 is a glass substrate.

step 2, sequentially forming a gate isolation layer 3 and an island shaped semiconductor layer 4 on the first metal electrode 2 and the substrate 1 by processes of film formation, exposure, development and etching.

Preferably, the island shaped semiconductor layer 4 is formed with amorphous silicon. The gate isolation layer 3 completely covers the first metal electrode 2.

step 3, deposing and patterning a second metal layer on the gate isolation layer 3 and the island shaped semiconductor layer 4 to form a second metal electrode 6.

step 4, deposing and patterning a protecting layer on the second metal electrode 6 for forming the protecting layer 8.

Significantly, from the steps 1 to 4, a Physical Vapor Deposition or a Chemical Vapor Deposition is employed for deposing the first metal electrode 2, the gate isolation layer 3, the island shaped semiconductor layer 4, the second metal electrode 6 and the protecting layers 8.

step 5, coating a color resist layer 7 on the protecting layer 8, and deposing and patterning a protecting layer on the color resist layer 7 for forming the protecting layer 12, and forming a via 81 on the protecting layer 8, the color resist layer 7 and the protecting layer 12.

Specifically, the color resist layer 7 is a RGB color resist layer. Preferably, a diameter of a top of the via 81 is 20 μm.

step 6, deposing and patterning a first pixel electrode layer on the protecting layer 12 and the second metal electrode 6 for forming the first pixel electrode layer 9, and the first pixel electrode layer 9 connects to the second metal electrode 6 with the via 81.

Specifically, a Physical Vapor Deposition is employed for deposing the first pixel electrode layer 9, and material of the first pixel electrode layer 9 is Indium Titanium Oxide (ITO) or Indium Zinc Oxide (IZO).

step 7, coating the organic material layer 10 on the first pixel electrode layer 9, and the organic material layer 10 fills the via 81.

At this moment, not only inside the via 81, the most top layer of the entire array substrate is coated with a flat organic material layer 10. Preferably, the organic material layer 10 is formed with photoresist type material.

step 8, implementing developing process to remove the organic material layer around the via.

Specifically, by controlling the speed of the developing process, the organic material layer 10 remains only inside the via 81 and no residual of the organic material layer 10 exist at the other positions except peripheral of the via 81 when the developing process is accomplished.

In this embodiment, by coating the organic material layer 10, the organic material fills up the inside of the via 81 to reduce the height difference of the landform and to prevent the orientation disorder of the liquid crystal. More significantly, the possibility that the liquid crystal hides bubble in the via 81 is eliminated to diminish the risk of bubble appearance.

Please refer to FIG. 1 and FIGS. 4-7, the second embodiment of the manufacture method of the TFT array substrate according to the present invention comprises steps of:

step 1, providing a substrate 1, and deposing and patterning a first metal layer on the substrate 1 to form a first metal electrode 2.

Preferably, the substrate 1 is a glass substrate.

step 2, sequentially forming a gate isolation layer 3 and an island shaped semiconductor layer 4 on the first metal electrode 2 and the substrate 1 by processes of film formation, exposure, development and etching.

Preferably, the island shaped semiconductor layer 4 is formed with amorphous silicon. The gate isolation layer 3 completely covers the first metal electrode 2.

step 3, deposing and patterning a second metal layer on the gate isolation layer 3 and the island shaped semiconductor layer 4 to form a second metal electrode 6.

step 4, deposing and patterning a protecting layer on the second metal electrode 6 for forming the protecting layer 8.

Significantly, from the step 1 to the step 4, a Physical Vapor Deposition or a Chemical Vapor Deposition is employed for deposing the first metal electrode 2, the gate isolation layer 3, the island shaped semiconductor layer 4, the second metal electrode 6 and the protecting layers 8.

step 5, coating a color resist layer 7 on the protecting layer 8, and deposing and patterning a protecting layer on the color resist layer 7 for forming the protecting layer 12, and forming a via 81 on the protecting layer 8, the color resist layer 7 and the protecting layer 12.

Specifically, the color resist layer 7 is a RGB color resist layer. Preferably, a diameter of a top of the via 81 is 20 μm.

step 6, deposing and patterning a first pixel electrode layer on the protecting layer 12 and the second metal electrode 6.

Specifically, a Physical Vapor Deposition is employed for deposing the first pixel electrode layer 9, and material of the first pixel electrode layer 9 is ITO or IZO.

step 7, coating the organic material layer 10 on the first pixel electrode layer, and the organic material layer 10 fills the via 81.

At this moment, not only inside the via 81, the most top layer of the entire array substrate is coated with a flat organic material layer 10. Preferably, the organic material layer 10 is formed with photoresist type material.

step 8, implementing developing process to remove the organic material layer around the via.

Specifically, by controlling the speed of the developing process, the organic material layer 10 remains only inside the via 81 and no residual of the organic material layer 10 exist at the other positions except peripheral of the via 81 when the developing process is accomplished.

step 9, deposing a second pixel electrode layer on the pixel electrode layer and the organic material layer 10.

Specifically, a Physical Vapor Deposition is employed for deposing the second pixel electrode layer, and material of the second pixel electrode layer is ITO or IZO.

step 10, patterning the first pixel electrode layer and the second pixel electrode layer at the same time with one photolithography process for forming the first pixel electrode layer 9 and the second pixel electrode layer 11, and the first pixel electrode layer 9 and the second pixel electrode layer 11 connects to the second metal electrode 6 with the via 81.

The differences of the second embodiment from the first embodiment is, after the first pixel electrode layer is deposed on the protecting layer 12 in the step 6, the patterning is not implemented temporarily but the steps 7-8 are directly operated. Then, the operation of the step 9 is executed to the substrate obtained in the step 8, i.e. deposing the second pixel electrode layer. Ultimately, the operation of the step 10 is executed for patterning the first pixel electrode layer and the second pixel electrode layer at the same time.

In the second embodiment, after the first pixel electrode layer is deposed, the large via 81 formed by COA process is filled up by coating the organic material layer 10. Then, a planarizing process is implemented thereto. After that, the process of deposing the second pixel electrode layer is implemented again. Ultimately, the patterning the first pixel electrode layer and the second pixel electrode layer is implemented at the same time. Not only the height difference of the landform is effectively eliminated but also the risk of bubble appearance is diminished. Because the pixel electrode layer almost has no height difference of the landform in the entire pixel area, the uniformity of the electric field in the curing process for the VA (Vertical Alignment) liquid crystal mode is increased and the orientation disorder the orientation disorder of the liquid crystal of the liquid crystal can be avoided. Meanwhile, the liquid crystal at the via 81 be effectively controlled and the pixel aperture ratio can be promoted in some degree.

Please refer to FIG. 3. The present invention provides a TFT array substrate structure, comprising a substrate 1, a first metal electrode 2 on the substrate 1, a gate isolation layer 3 positioned on the substrate 1 and completely covering the first metal electrode 2, an island shaped semiconductor layer 4 on the gate isolation layer 3, a second metal electrode 6 on the gate isolation layer 3 and the island shaped semiconductor layer 4, a protecting layer 8 on the second metal electrode 6, a color resist layer 7 on the protecting layer 8, a protecting layer 12 on the color resist layer 7 and a first pixel electrode layer 9 on the protecting layer 12; a via 81 is formed on the protecting layer 8, the color resist layer 7 and the protecting layer 12, and an organic material layer 12 fills the inside of the via 81; the substrate 1 is a glass substrate, and the island shaped semiconductor layer 4 is formed with amorphous silicon, and the color resist layer 7 is a RGB color resist layer, and material of the first pixel electrode layer 9 is ITO or IZO, and the organic material layer 10 is formed with photoresist type material.

Figure 7:
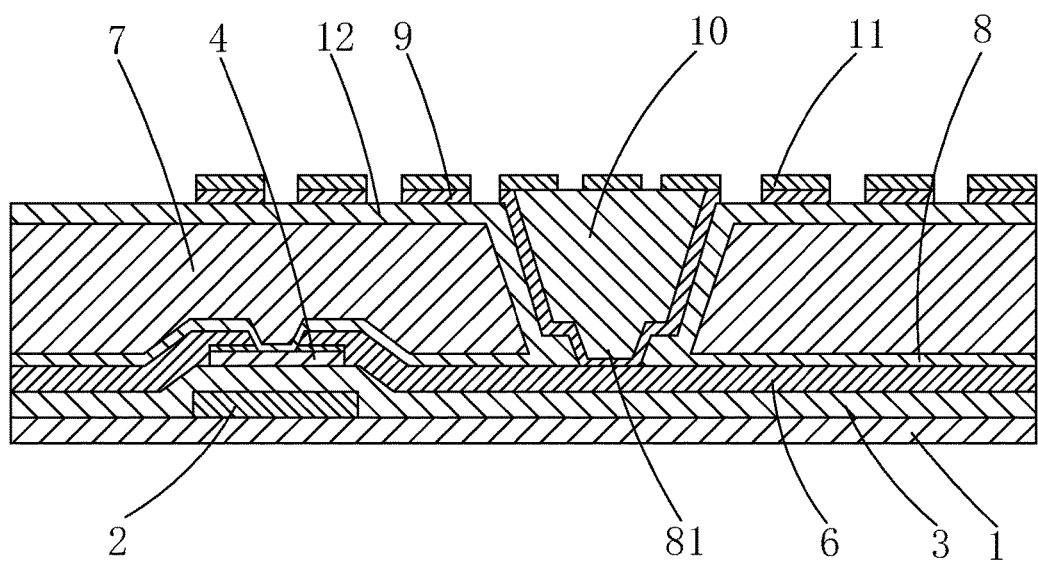
FIG. 7 is a diagram of step 10 in the second embodiment of the manufacture method of the TFT array substrate according to the present invention.

Please refer to FIG. 7. The present invention further provides a TFT array substrate structure. The differences from the previous embodiment is that the structure further comprises a second pixel electrode layer 11 on the first pixel electrode layer 9 and the organic material layer 10. Preferably, material of the second pixel electrode layer 11 is ITO or IZO.

In conclusion, according to the manufacture method of the TFT array substrate and the TFT array substrate structure provided by the present invention, by filling the via with organic material and forming two pixel electrode layers to reduce the height difference of the landform thereof. Basically, the pixel utilizing the structure is totally flat and smooth. The effective control area of the pixel electrode is increased to raise the pixel aperture ratio; the risk of bubble appearance is diminished because the larger via is filled up to reduce the height difference of the landform; the uniformity of the curing electric field is increased to prevent the orientation disorder of the liquid crystal because the liquid crystal at the via can be effectively controlled and no landform difference in the electric field.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a thin film transistor (TFT) array substrate, comprising steps of:

step 1, providing a substrate, and deposing and patterning a first metal layer on the substrate to form a first metal electrode;

step 2, forming a gate isolation layer and an island shaped semiconductor layer on the first metal electrode and the substrate;

step 3, deposing and patterning a second metal layer on the gate isolation layer and the island shaped semiconductor layer to form a second metal electrode;

step 4, deposing and patterning a first layer on the second metal electrode for forming a first protecting layer;

step 5, coating a color resist layer on the first protecting layer, and deposing and patterning a second layer on the color resist layer for forming a second protecting layer, and forming a via in the second protecting layer, the color resist layer and the first protecting layer so as to expose a portion of the second metal electrode; and step 6, forming a pixel electrode layer and an organic material layer on the second protecting layer and the second metal electrode, wherein step 6 comprises the following sub-steps:

forming a first pixel electrode layer on the second protecting layer and the portion of the second metal electrode exposed in the via;

coating the organic material layer on the first pixel electrode layer so that the organic material fills up the via;

removing portions of the organic material layer that are located outside and around the via such that a remaining portion of the organic material layer is left in the via and a portion of the first pixel electrode layer that is located outside and around the via is exposed;

forming a second pixel electrode layer on the exposed portion of the first pixel electrode layer that is located outside the via and the remaining portion of the organic material layer that is left in the via; and patterning the first pixel electrode layer and the second pixel electrode layer at the same time with one photolithography process to form, respectively, a first pixel electrode and a second pixel electrode that collectively form a pixel electrode that is connected to the second metal electrode through the via.

2. The manufacture method of the TFT array substrate according to claim 1, wherein from the first step to the fourth step, a Physical Vapor Deposition or a Chemical Vapor Deposition is employed for deposing the first metal electrode layer, the gate isolation layer, a semiconductor layer from which the island shaped semiconductor layer was formed, the second metal electrode layer and the first and second protecting layers.

3. The manufacture method of the TFT array substrate according to claim 1, wherein in the first step, the substrate is a glass substrate; in the second step, the island shaped semiconductor layer is formed with amorphous silicon, and the gate isolation layer and the island shaped semiconductor layer are sequentially formed by processes of film formation, exposure, development and etching.

4. The manufacture method of the TFT array substrate according to claim 1, wherein in the fifth step, the color resist layer is a red/green/blue color resist layer, and a diameter of a top of the via is 20 μm, and the organic material layer is formed with a photoresist type material.

5. The manufacture method of the TFT array substrate according to claim 1, wherein the first pixel electrode layer is formed of a material of indium tin oxide (ITO) or indium zinc oxide (IZO) through physical vapor deposition.

6. The manufacture method of the TFT array substrate according to claim 1, wherein the second pixel electrode layer is formed of a material of indium tin oxide (ITO) or indium zinc oxide (IZO) through physical vapor deposition.

* * * * *